(«12») United States Patent
Yang et al.

(10) Patent No.: US 9,870,175 B1
(45) Date of Patent: Jan. 16, 2018

(54) CONTROL CHIP MEMORY POWER SEQUENCE

(71) Applicant: Nuvoton Technology Corporation, Hsinchu (TW)

(72) Inventors: Hsin-Lung Yang, Hsinchu (TW); Ming-Che Hung, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/585,188

(22) Filed: May 3, 2017

(30) Foreign Application Priority Data

Jul. 27, 2016 (TW) .............................. 105211307 U

(51) Int. Cl.
*G11C 7/00* (2006.01)
*G06F 3/06* (2006.01)
*G11C 11/4074* (2006.01)
*G11C 11/4096* (2006.01)

(52) U.S. Cl.
CPC .......... *G06F 3/0659* (2013.01); *G06F 3/0604* (2013.01); *G06F 3/0673* (2013.01); *G11C 11/4074* (2013.01); *G11C 11/4096* (2013.01)

(58) Field of Classification Search
None
See application file for complete search history.

(56) References Cited

U.S. PATENT DOCUMENTS

2014/0306685 A1\* 10/2014 Zhou ..................... H02M 3/158
323/311

\* cited by examiner

*Primary Examiner* — Son Dinh
(74) *Attorney, Agent, or Firm* — JCIPRNET

(57) ABSTRACT

A control chip for memory power sequence including input pins, a control circuit and output pins is provided. The control chip is compatible with a plurality of processor platforms. The input pins are configured to receive control signals corresponding to each of the processor platforms. The control circuit is configured to determine a selected processor platform among the processor platforms in which the control chip for memory power sequence is operated, and generate corresponding power switching signals according to the control signals of the selected processor platform. The output pins are configured to output the corresponding power switching signals to control a power sequence of a memory on the selected processor platform.

10 Claims, 6 Drawing Sheets

CONTROL CHIP MEMORY POWER SEQUENCE

CROSS-REFERENCE TO RELATED APPLICATION

This application claims the priority benefit of Taiwan application serial no. 105211307, filed on Jul. 27, 2016. The entirety of the above-mentioned patent application is hereby incorporated by reference herein and made a part of this specification.

BACKGROUND OF THE DISCLOSURE

1. Field of the Disclosure

The present disclosure relates to a control chip, and more particularly, to a control chip for memory power sequence and compatible with a plurality of processor platforms.

2. Description of Related Art

In general, different processor platforms (e.g., an Intel processor platform or an AMD processor platform) have different requirements in a power sequence of a dynamic random access memory (DRAM) installed thereon.

For instance, power-supply sources required by a double-data-rate fourth generation synchronous dynamic random access memory (DDR4 SDRAM) circuit include a VPP power source (2.5 V), a VDD power source (or a VDDQ power source, 1.2 V) and a VTT power source (0.6 V). When the computer designers participate in development of computer products including an Intel 2016 KabyLake processor platform installed with the DDR4 SDRAM, the computer designers need to achieve power sequences (developed by Intel) of the VPP power source, the VDD power source (or the VDDQ power source) and the VTT power source of the DDR4 SDRAM as required by the Intel 2016 KabyLake processor platform. Similarly, when the computer designers participate in development of computer products including an AMD 2017 AM4 processor platform installed with the DDR4 SDRAM, the computer designers need to achieve power sequences (developed by AMD) of the VPP power source, the VDD power source (or the VDDQ power source) and the VTT power source of the DDR4 SDRAM as required by the AMD 2017 AM4 processor platform.

Because the power sequences of the DDR4 SDRAM required by the Intel 2016 KabyLake processor platform is more complex, Intel recommends the designers to adopt a specific logic chip for the public version circuit design (that is, a reference circuit design). Further, because the power sequence of the DDR4 SDRAM required by the AMD 2017 AM4 processor platform is simpler, AMD recommends the designers to adopt a discrete circuit for the public version circuit design. For this reason, the designers are bounded to prepare different circuit components (e.g., the specific logic chip and the discrete circuit as described above) for the different processor platforms, and increases on the complexity and the costs for material preparation are unavoidable.

SUMMARY OF THE DISCLOSURE

In view of the foregoing, the present disclosure provides a control chip for memory power sequence and compatible with a plurality of processor platforms, so that a development time may be reduced for the circuit designers and complexity and costs of material preparation are also reduced.

A control chip for memory power sequence of the present disclosure includes a plurality of input pins, a platform selection circuit, a plurality of power sequence circuits, an input selection circuit, an output selection circuit and a plurality of output pins. The input pins are configured to receive control signals corresponding to each of the processor platforms. The platform selection circuit is configured to provide at least one selection signal instructing the control chip for memory power sequence to be operated in a selected processor platform among the processor platforms. Each of the power sequence circuits is configured to generate a plurality of power switching signals of one of the processor platforms according to the control signals. The input selection circuit is coupled to the input pins to receive the control signals, coupled to the platform selection circuit to receive the selection signal, and configured to transmit the control signals to one of the power sequence circuits according to the selection signal. The output selection circuit is coupled to the platform selection circuit to receive the selection signal, coupled to the power sequence circuits to receive the power switching signals of each of the power sequence circuits, and configured to select the power switching signals of said one of the power sequence circuits according to the selection signal. The output pins are coupled to the output selection circuit, and output the selected power switching signals to control a power sequence of a memory on the selected processor platform.

Preferably, the control chip for memory power sequence of the present disclosure may be compatible with an Intel processor platform and an AMD processor platform. The control chip includes a first multi-function pin, a second multi-function pin, a third function pin, a fourth multi-function pin, a fifth multi-function pin, a sixth multi-function pin, a seventh multi-function pin and a control circuit. The first multi-function pin is configured to receive a SLP_S4# signal of a chip set of the Intel processor platform, or configured to receive a SLP_S5# signal of an application processor unit (APU) of the AMD processor platform. The second multi-function pin is configured to receive a VPP_PG signal of the Intel processor platform, or configured to receive an AM4R1 signal of the application processor unit of the AMD processor platform. The third function pin is configured to receive a SLP_S3# signal of the chip set of the Intel processor platform, or configured to receive a SLP_S3# signal of the application processor unit of the AMD processor platform. The fourth multi-function pin is configured to receive a DDR_VTT_CNTL signal of a central processor unit of the Intel processor platform, or configured to receive a S0A3_GPIO signal of the application processor unit of the AMD processor platform. The control circuit is coupled to the first multi-function pin, the second multi-function pin, the third function pin and the fourth multi-function pin. When the control circuit determines that the control chip for memory power sequence is operated in the Intel processor platform, the control circuit correspondingly generates a first power switching signal, a second power switching signal and a third power switching signal according to the SLP_S4# signal, the VPP_PG signal, the SLP_S3# signal and the DDR_VTT_CNTL signal. When the control circuit determines that the control chip for memory power sequence is operated in the AMD processor platform, the control circuit correspondingly generates the first power switching signal, the second power switching signal and the third power switching signal according to the SLP_S5# signal, the AM4R1 signal, the SLP_S3#signal and the S0A3_GPIO signal. The fifth multi-function pin is coupled to the control circuit, and configured to output the first power switching signal to control a power sequence of a VPP power source of a DDR4 SDRAM circuit of the Intel processor platform or the AMD processor platform. The sixth multi-function pin is coupled to the control circuit, and configured to output the second power switching signal to control a power sequence of a VDD power source or a VDDQ power source of the DDR4 SDRAM circuit. The seventh multi-function pin is coupled to the control circuit, and configured to output the third power switching signal to control a power sequence of a VTT power source of the DDR4 SDRAM circuit.

In an embodiment of the present disclosure, aforesaid Intel processor platform includes an Intel 2016 KabyLake processor platform or an Intel 2015 SkyLake processor platform; and aforesaid AMD processor platform includes an AMD 2017 AM4 processor platform.

Based on the above, the control chip for memory power sequence proposed by the present disclosure is compatible with multiple processor platforms. That is to say, the control chip for memory power sequence proposed by the embodiments of the present disclosure can provide a complete solution to the power sequence of the memory circuit for different processor platforms. As a result, the development time may be reduced for the circuit designers while also reducing the complexity and costs of material preparation for the different processor platforms.

In order to make the aforementioned and other features and advantages of the present disclosure more comprehensible, several embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
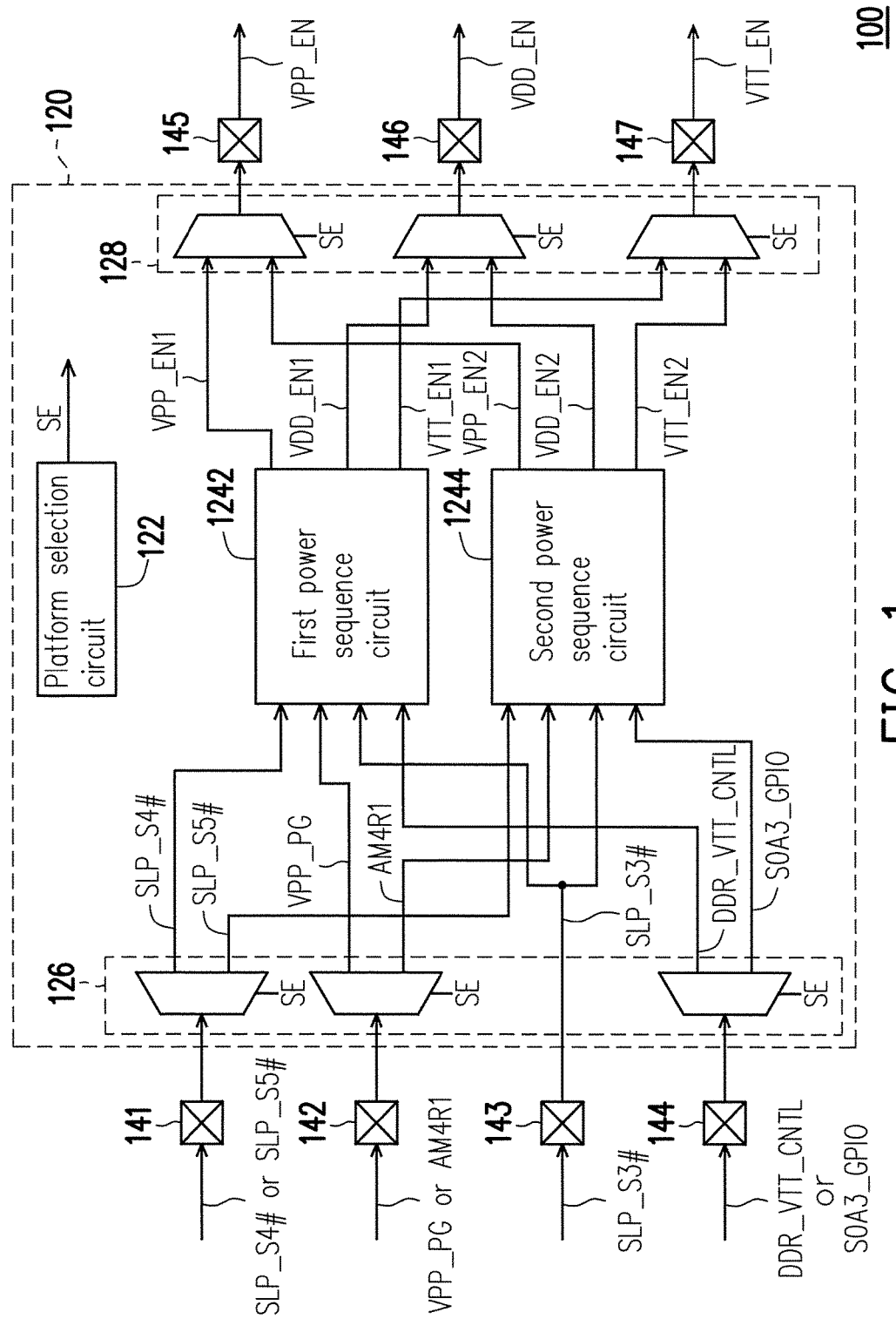
FIG. 1 is a block diagram illustrating a control chip for memory power sequence according to an embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

The control chip for memory power sequence proposed by the present disclosure is compatible with a plurality of different processor platforms (e.g., an Intel processor platform and an AMD processor platform, but not limited thereto), and can provide, according to a selected processor platform, a power sequence matching a specification of the selected processor platform to a memory. Aforesaid memory may be any type of dynamic random access memory. However, for illustrative convenience, the following embodiments are described by using two processor platforms, including an Intel 2016 KabyLake processor platform and an AMD 2017 AM4 processor platform, each of which is installed with a DDR4 SDRAM circuit. Persons skilled in the art should be able to derive implementations for other types of processor platform or more than two processor platforms as well as for the processor platform installed with other type of memory according to the following contents. Particularly, because a power sequence of the DDR4 SDRAM of the Intel 2016 KabyLake processor platform is identical to a power sequence of a DDR4 SDRAM of an Intel 2015 SkyLake processor platform, the following embodiments as provided by the present disclosure are also suitable for the Intel 2015 SkyLake processor platform.

Figure 2:
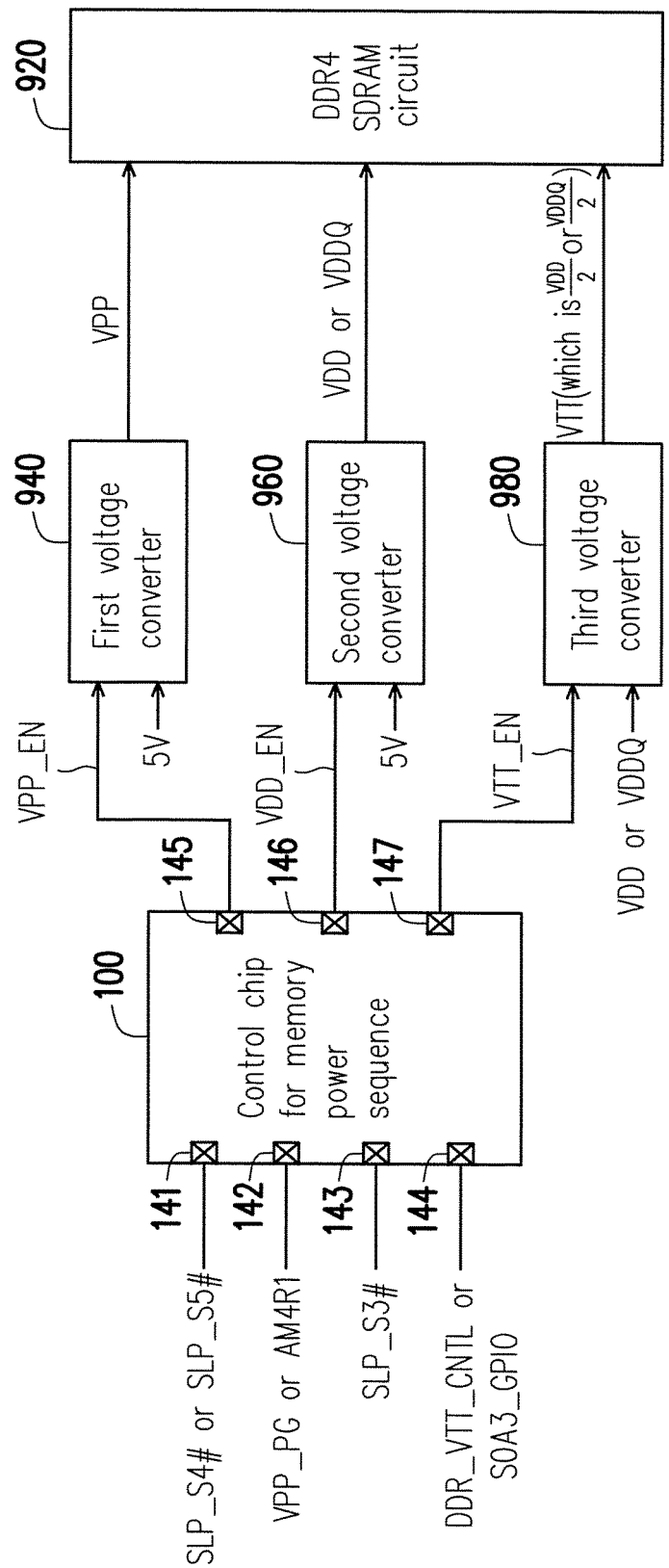
FIG. 2 is a schematic diagram illustrating application of the control chip for memory power sequence of FIG. 1.

Referring to FIG. 1 and FIG. 2 together, FIG. 1 is a block diagram illustrating a control chip 100 for memory power sequence according to an embodiment of the present disclosure, and FIG. 2 is a schematic diagram illustrating application of the control chip 100 for memory power sequence of FIG. 1. The control chip 100 for memory power sequence is compatible with the Intel 2016 KabyLake processor platform and the AMD 2017 AM4 processor platform, and can provide, according to a selected processor platform, a power sequence matching a specification of the selected processor platform to a DDR4 SDRAM circuit 920. The DDR4 SDRAM circuit 920 may include at least one DDR4 component or may include a DDR4 memory module, depending on practical usages or design requirements.

In an embodiment of the present disclosure, the control chip 100 for memory power sequence may be implemented by adopting an application-specific integrated circuit (ASIC) or a field programmable gate array (FPGA), or a programmable logic device (PLD) such as a complex programmable logic device (CPLD), but the present disclosure is not limited thereto.

The control chip 100 for memory power sequence may include a plurality of input pins, a control circuit 120 and a plurality of output pins. The input pins may include a first multi-function pin 141, a second multi-function pin 142, a third function pin 143 and a fourth multi-function pin 144. The output pins may include a fifth multi-function pin 145, a sixth multi-function pin 146 and a seventh multi-function pin 147; however, the present disclosure is not limited thereto. The number of said input pins and the number of the output pins may be decided depending on the type of the processor platform supported by the control chip 100 for memory power sequence and the type of the memory installed thereon.

Referring to Table 1, if the control chip 100 for memory power sequence is operated in the Intel 2016 KabyLake processor platform, the first multi-function pin 141 may be configured to receive a SLP_S4# signal (control signal) of a chip set of the Intel 2016 KabyLake processor platform, and the second multi-function pin 142 may be configured to receive a VPP_PG signal (control signal) of the Intel 2016 KabyLake processor platform. The VPP_PG signal is configured to indicate whether the VPP power source on the Intel 2016 KabyLake processor platform is ready. The third function pin 143 may be configured to receive a SLP_S3# signal (control signal) of the chip set of the Intel 2016 KabyLake processor platform, and the fourth multi-function pin 144 may be configured to receive a DDR_VTT_CNTL signal (control signal) of a central processor unit (CPU) of the Intel 2016 KabyLake processor platform.

Comparatively, if the control chip 100 for memory power sequence is operated in the AMD 2017 AM4 processor platform, the first multi-function pin 141 may be configured to receive a SLP_S5# signal (control signal) of an application processor unit (APU) of the AMD 2017 AM4 processor platform, the second multi-function pin 142 may be configured to receive an AM4R1 signal (control signal) of the application processor unit of the AMD 2017 AM4 processor platform, the third function pin 143 may be configured to receive a SLP_S3# signal (control signal) of the application processor unit of the AMD 2017 AM4 processor platform, and the fourth multi-function pin 144 may be configured to receive a S0A3_GPIO signal (control signal) of the application processor unit of the AMD 2017 AM4 processor platform.

TABLE 1

|  | Intel 2016 KabyLake | AMD 2017 AM4 |
| --- | --- | --- |
| First multi-function pin | SLP_S4# signal | SLP_S5# signal |
| Second multi-function pin | VPP_PG signal | AM4R1 signal |
| Third function pin | SLP_S3# signal | SLP_S3# signal |
| Fourth multi-function pin | DDR_VIT_CNTL signal | S0A3_GPIO signal |
| Fifth multi-function pin | First power switching signal VPP_EN | |
| Sixth multi-function pin | Second power switching signal VDD_EN | |
| Seventh multi-function pin | Third power switching signal VTT_EN | |

The control circuit 120 is coupled to the first multi-function pin 141, the second multi-function pin 142, the third function pin 143 and the fourth multi-function pin 144. The control circuit 120 can determine whether the control chip 100 for memory power sequence is operated in the Intel 2016 KabyLake processor platform or operated in the AMD 2017 AM4 processor platform, details regarding the same will be described later.

When the control circuit 120 determines that the control chip 100 for memory power sequence is operated in the Intel 2016 KabyLake processor platform, the control circuit 120 can correspondingly generate the first power switching signal VPP_EN, the second power switching signal VDD_EN and the third power switching signal VTT_EN according to the SLP_S4# signal, the VPP_PG signal, the SLP_S3# signal and the DDR_VTT_CNTL signal of the Intel 2016 KabyLake processor platform, so as to provide a power sequence matching the specification of the Intel 2016 KabyLake processor platform (developed by Intel, and details regarding the same will be described later) to the DDR4 SDRAM circuit 920. When the control circuit 120 determines that the control chip 100 for memory power sequence is operated in the AMD 2017 AM4 processor platform, the control circuit 120 can correspondingly generate the first power switching signal VPP_EN, the second power switching signal VDD_EN and the third power switching signal VTT_EN according to the SLP_S5# signal, the AM4R1 signal, the SLP_S3# signal and the S0A3_GPIO signal of the AMD 2017 AM4 processor platform, so as to provide a power sequence matching the specification of the AMD 2017 AM4 processor platform (developed by AMD, and details regarding the same will be described later) to the DDR4 SDRAM circuit 920.

As described above, the power-supply sources required in normal operation of the DDR4 SDRAM circuit 920 may include the VPP power source, the VDD power source or the VDDQ power source, and the VTT power source. Therefore, the fifth multi-function pin 145 may be configured to output the first power switching signal VPP_EN to control a power sequence of the VPP power source of the DDR4 SDRAM circuit 920; the sixth multi-function pin 146 may be configured to output the second power switching signal VDD_EN to control a power sequence of the VDD power source or the VDDQ power source of the DDR4 SDRAM circuit 920; and the seventh multi-function pin 147 may be configured to output the third power switching signal VTT_EN to control a power sequence of the VTT power source of the DDR4 SDRAM circuit 920. As a result, the purpose of controlling the power sequence of the DDR4 SDRAM circuit 920 may be achieved.

In an embodiment of the present disclosure, a voltage value of the VPP power source may be 2.5 V, a voltage value of the VDD power source or the VDDQ power source may be 1.2 V, and a voltage value of the VTT power source is half the voltage value of the VDD power source (or the VDDQ power source), that is, 0.6 V. However, the present disclosure is not limited thereto. In other embodiments of the present disclosure, the voltage value of the VDD power source or the VDDQ power source may also be less than 1.2 V, depending on a power specification of the adopted DDR4 SDRAM circuit 920. Because the voltage value of the VTT power source is half the voltage value of the VDD power source (or the VDDQ power source), the voltage value of the VTT power source will also be changed as the voltage value of the VDD power source (or the VDDQ power source) is changed.

For instance, as shown in FIG. 2, the fifth multi-function pin 145 may be configured to output the first power switching signal VPP_EN to a first voltage converter 940, so the first voltage converter 940 can convert (e.g., drop) a received input voltage (e.g., 5 V, but not limited thereto) within an enable period of the first power switching signal VPP_EN into 2.5 V to serve as the VPP power source of the DDR4 SDRAM circuit 920. The sixth multi-function pin 146 may be configured to output the second power switching signal VDD_EN to a second voltage converter 960, so the second voltage converter 960 can convert (e.g., drop) a received input voltage (e.g., 5 V, but not limited thereto) within an enable period of the second power switching signal VDD_EN into 1.2 V (but not limited thereto, depending on the power specification of the adopted DDR4 SDRAM circuit 920) to serve as the VDD power source or the VDDQ power source of the DDR4 SDRAM circuit 920. The seventh multi-function pin 147 may be configured to output the third power switching signal VTT_EN to a third voltage converter 980, so the third voltage converter 980 can convert (e.g., drop) a received input voltage (e.g., 1.2 V voltage for the VDD power source or the VDDQ power source, but not limited thereto) within an enable period of the third power switching signal VTT_EN into 0.6 V (but not limited thereto, depending on the power specification of the adopted DDR4 SDRAM circuit 920) to serve as the VTT power source of the DDR4 SDRAM circuit 920.

Architectures and operations of the control circuit 120 are described as follows. In an embodiment of the present disclosure, as shown in FIG. 1, the control circuit 120 may include a platform selection circuit 122, a plurality of power sequence circuits (including a first power sequence circuit 1242 and a second power sequence circuit 1244), an input selection circuit 126 and an output selection circuit 128, but the present disclosure is not limited thereto. The platform selection circuit 122 may be configured to provide at least one selection signal SE instructing the control chip 100 for memory power sequence to be operated in the Intel 2016 KabyLake processor platform or operated in the AMD 2017 AM4 processor platform.

The input selection circuit 126 and the output selection circuit 128 are coupled to the platform selection circuit 122 to receive the selection signal SE. When the selection signal SE instructs the control chip 100 for memory power sequence to be operated in the Intel 2016 KabyLake processor platform, which is the selected processor platform, the input selection circuit 126 may be controlled by the selection signal SE to transmit the SLP_S4# signal, the VPP_PG signal and the DDR_VTT_CNTL signal of the Intel 2016 KabyLake processor platform to the first power sequence circuit 1242. Meanwhile, the SLP_S3# signal of the Intel 2016 KabyLake processor platform is directly transmitted to the first power sequence circuit 1242 via the third function pin 143. The first power sequence circuit 1242 can accordingly generate a first power switching signal VPP_EN1, a second power switching signal VDD_EN1 and a third power switching signal VTT_EN1 corresponding to the Intel 2016 KabyLake processor platform. The output selection circuit 128 may be controlled by the selection signal SE to output the first power switching signal VPP_EN1, the second power switching signal VDD_EN1 and the third power switching signal VTT_EN1 generated by the first power sequence circuit 1242.

Comparatively, when the selection signal SE instructs the control chip 100 for memory power sequence to be operated in the AMD 2017 AM4 processor platform which is the selected processor platform, the input selection circuit 126 may be controlled by the selection signal SE to transmit the SLP_S5# signal, the AM4R1 signal and the S0A3_GPIO signal of the AMD 2017 AM4 processor platform to the second power sequence circuit 1244. Meanwhile, the SLP_S3# signal of the AMD 2017 AM4 processor platform is directly transmitted to the second power sequence circuit 1244 via the third function pin 143. The second power sequence circuit 1244 can accordingly generate a first power switching signal VPP_EN2, a second power switching signal VDD_EN2 and a third power switching signal VTT_EN2 corresponding to the AMD 2017 AM4 processor platform. The output selection circuit 128 may be controlled by the selection signal SE to output the first power switching signal VPP_EN2, the second power switching signal VDD_EN2 and the third power switching signal VTT_EN2 generated by the second power sequence circuit 1244.

In an embodiment of the present disclosure, as shown in FIG. 1, the input selection circuit 126 may be implemented by adopting a de-multiplexer, and the output selection circuit 128 may be implemented by adopting a multiplexer. However, the present disclosure is not limited these examples.

In an embodiment of the present disclosure, the platform selection circuit 122 may include at least one strap pin, and the strap pin is configured to connect to a voltage and output the selection signals SE accordingly. For instance, the strap pin may be pulled up to a power voltage level through resistors or switches or jumpers outside the control chip 100 for memory power sequence to generate the selection signal with logic high level, so as to instruct the control chip 100 for memory power sequence to be operated in the AMD 2017 AM4 processor platform; or, the strap pin may be pulled down to a ground voltage level through resistors or switches or jumpers outside the control chip 100 for memory power sequence to generate the selection signal with logic low level, so as to instruct the control chip 100 for memory power sequence to be operated in the Intel 2016 KabyLake processor platform. In addition, a correspondence relation between the logic level of the selection signal SE and the type of the processor platform described above is merely an illustrative example. Persons with ordinary skill in the art should know that, the correspondence relation between the selection signal SE with high/low logic level and the type of the processor platform may be defined by the designers according to practical requirements.

In another embodiment of the present disclosure, the platform selection circuit 122 may include a one-time programmable storage or a register, which may be used to store and provide the selection signal SE.

Figure 3A:
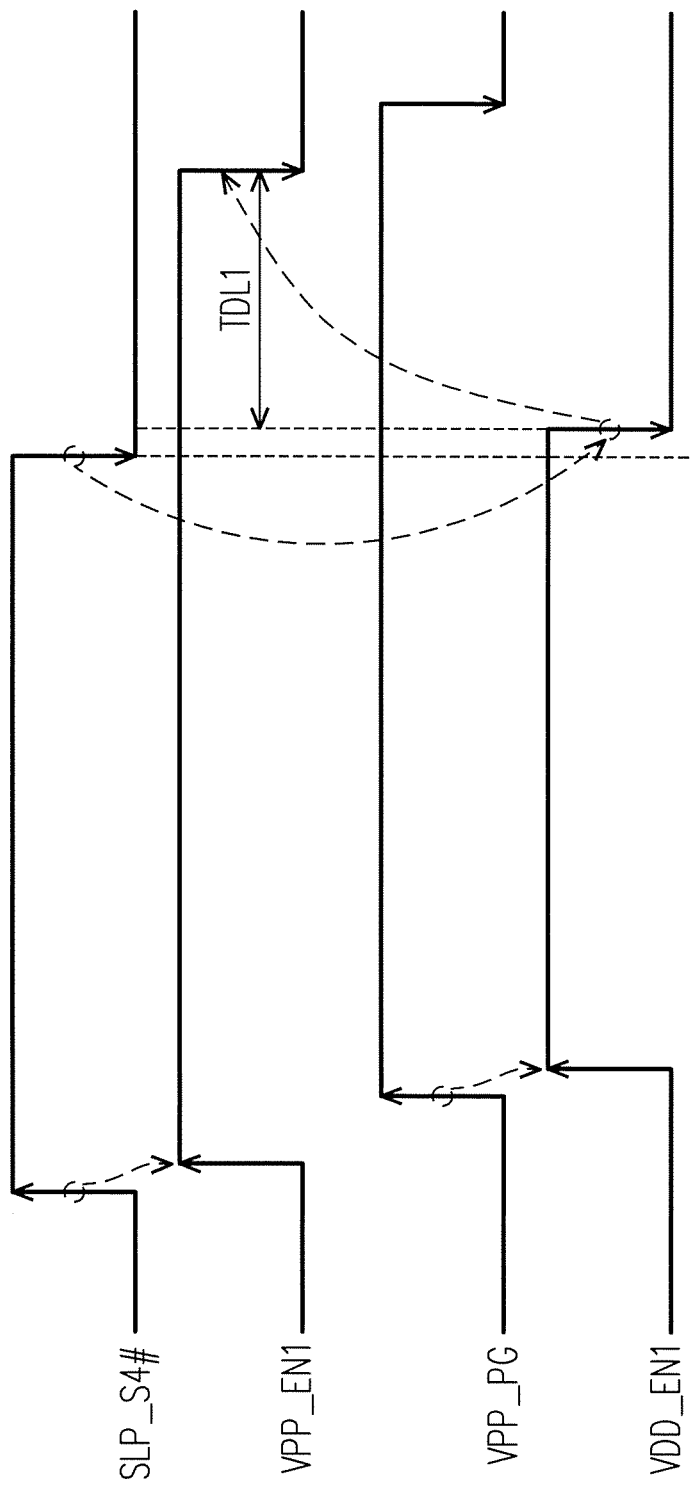
FIG. 3A illustrates a part of signal sequences of the first power sequence circuit of FIG. 1.
Figure 3B:
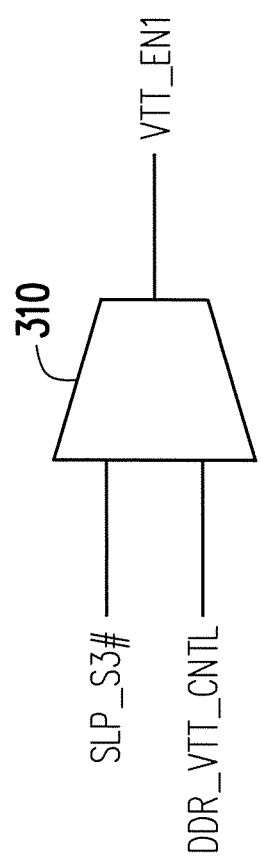
FIG. 3B is a schematic diagram of circuitry implementation for the third power switching signal of the first power sequence circuit of FIG. 1.

The following description refers to FIG. 1, FIG. 2, FIG. 3A and FIG. 3B together. FIG. 3A illustrates a part of signal sequences of the first power sequence circuit 1242 of FIG. 1, and FIG. 3B is a schematic diagram of circuitry implementation for the third power switching signal VTT_EN1 of the first power sequence circuit 1242 of FIG. 1, as developed by Intel. As shown in FIG. 3A, the first power sequence circuit 1242 can enable the first power switching signal VPP_EN1 after the SLP_S4# signal is enabled. The first power sequence circuit 1242 can enable the second power switching signal VDD_EN1 after the VPP_PG signal is enabled. The first power sequence circuit 1242 can disable the second power switching signal VDD_EN1 after the SLP_S4# signal is disabled. The first power sequence circuit 1242 can disable the first power switching signal VPP_EN1 after the second power switching signal VDD_EN1 is disabled for a first delay time TDL1. Further, as shown in FIG. 3B, a multiplexer 310 in the first power sequence circuit 1242 may be configured to receive the SLP_S3# signal and the DDR_VTT_CNTL signal, and select one of the SLP_S3# signal and the DDR_VTT_CNTL signal (based on practical usages or design requirements) to serve as the third power switching signal VTT_EN1. Because the first power sequence circuit 1242 is operated according to the sequence developed by Intel and is not the subject matter of the present disclosure, persons skilled in the art should be able to realize the first power sequence circuit 1242 according to the signal sequence diagram in FIG. 3A, and thus details regarding the same is not repeated hereinafter.

Figure 4A:
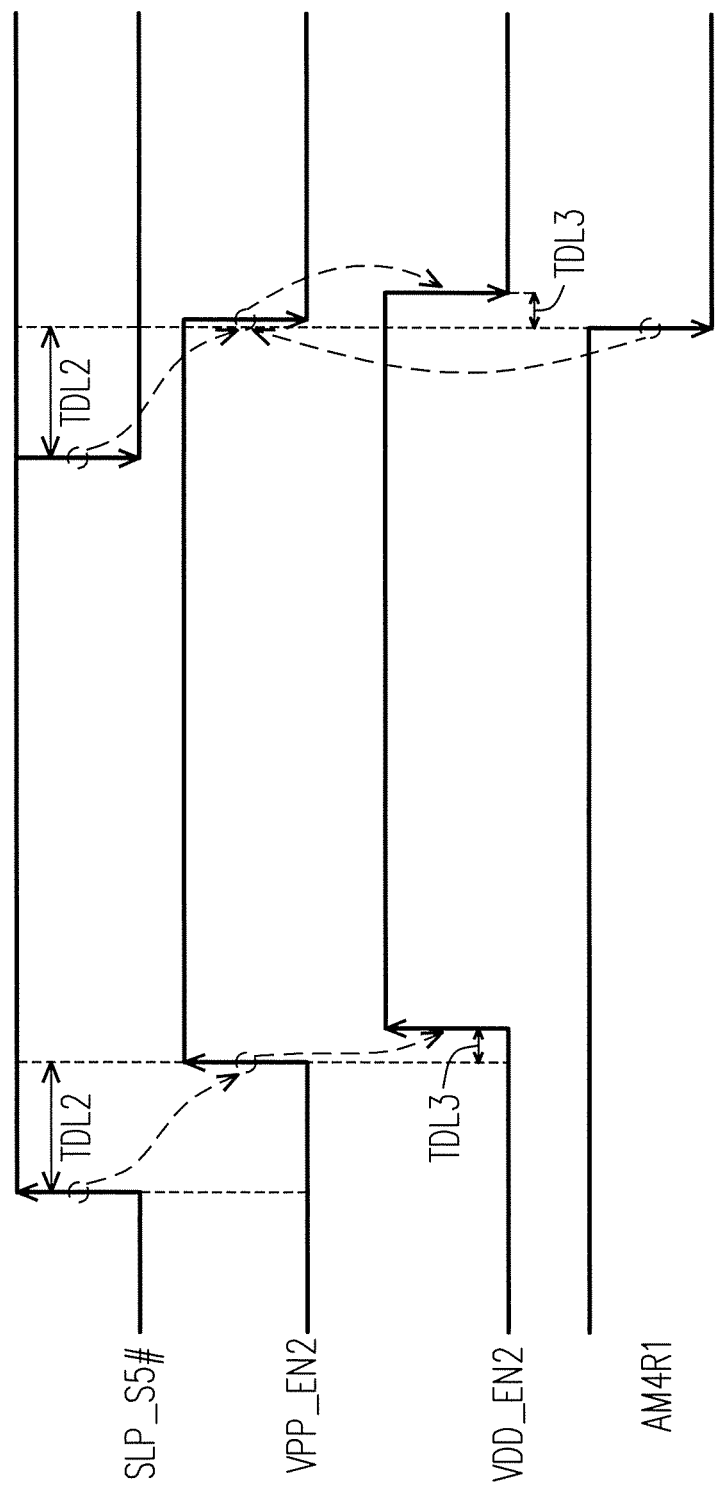
FIG. 4A illustrates a part of signal sequences of the second power sequence circuit of FIG. 1.
Figure 4B:
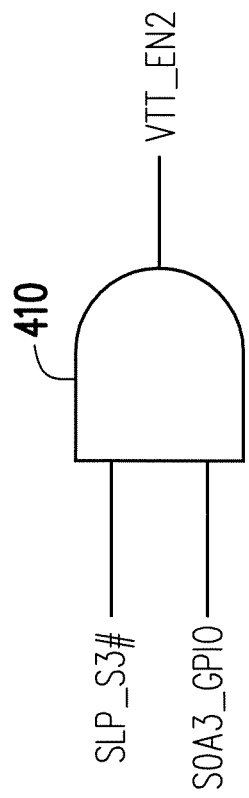
FIG. 4B is a schematic diagram of circuitry implementation for the third power switching signal of the second power sequence circuit of FIG. 1.

The following description refers to FIG. 1, FIG. 2, FIG. 4A and FIG. 4B together. FIG. 4A illustrates a part of signal sequences of the second power sequence circuit 1244 of FIG. 1, and FIG. 4B is a schematic diagram of circuitry implementation for the third power switching signal VTT_EN2 of the first power sequence circuit 1244 of FIG. 1, as developed by AMD. As shown in FIG. 4A, the second power sequence circuit 1244 can enable the first power switching signal VPP_EN2 after the SLP_S5# signal is enabled for a second delay time TDL2. The second power sequence circuit 1244 can enable the second power switching signal VDD_EN2 after the first power switching signal VPP_EN2 is enabled for a third delay time TDL3. The second power sequence circuit 1244 can disable the first power switching signal VPP_EN2 after the SLP_S5# signal is disabled for the second delay time TDL2 or after the AM4R1 signal is disabled. The second power sequence circuit 1244 can disable the second power switching signal VDD_EN2 after the first power switching signal VPP_EN2 is disabled for the third delay time TDL3. Further, as shown in FIG. 4B, an AND gate 410 in the second power sequence circuit 1244 may be configured to receive the SLP_S3# signal and the S0A3_GPIO signal and accordingly generate the third power switching signal VTT_EN2. In other words, the second power sequence circuit 1244 can enable the third power switching signal VTT_EN2 after the SLP_S3# signal and the S0A3_GPIO signal are both enabled. The second power sequence circuit 1244 can disable the third power switching signal VTT_EN2 after the SLP_S3# signal is disabled or after the S0A3_GPIO signal is disabled. Because the second power sequence circuit 1244 is operated according to the sequence developed by AMD and is not the subject matter of the present disclosure, persons skilled in the art should be able to the second power sequence circuit 1244 according to the signal sequence diagram in FIG. 4A, and thus details regarding the same is not repeated hereinafter.

In summary, the control chip for memory power sequence proposed by the embodiments of the present disclosure is compatible with multiple processor platforms. That is to say, the control chip for memory power sequence proposed by the embodiments of the present disclosure can provide a complete solution to the power sequence of the memory circuit for different processor platforms. As a result, the development time may be reduced for the circuit designers while also reducing the complexity and costs of material preparation for the different processor platforms.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A control chip for memory power sequence compatible with a plurality of processor platforms, the control chip comprising:
   a plurality of input pins, configured to receive a plurality of control signals corresponding to each of the processor platforms;
   a platform selection circuit, configured to provide at least one selection signal instructing the control chip for memory power sequence to be operated in a selected processor platform among the plurality of processor platforms;
   a plurality of power sequence circuits, each of the power sequence circuits being configured to generate a plurality of power switching signals of one of the processor platforms according to the control signals;
   an input selection circuit, coupled to the input pins to receive the control signals, coupled to the platform selection circuit to receive the at least one selection signal, and transmitting the control signals to one of the power sequence circuits according to the at least one selection signal;
   an output selection circuit, coupled to the platform selection circuit to receive the at least one selection signal, coupled to the power sequence circuits to receive the power switching signals of each of the power sequence circuits, and selecting the power switching signals of said one of the power sequence circuits according to the at least one selection signal; and
   a plurality of output pins, coupled to the output selection circuit, and outputting the selected power switching signals to control a power sequence of a memory on the selected processor platform.

2. The control chip for memory power sequence according to claim 1, wherein the platform selection circuit comprises:
   at least one strap pin, wherein the at least one strap pin is configured to connect to a voltage, and outputs the at least one selection signal accordingly.

3. The control chip for memory power sequence according to claim 1, wherein the platform selection circuit comprises:
   a one-time programmable storage or a register, configured to store and provide the at least one selection signal.

4. The control chip for memory power sequence according to claim 1, wherein the processor platforms comprise an AMD 2017 AM4 processor platform and an Intel 2016 KabyLake processor platform or an Intel 2015 SkyLake processor platform, and the memory comprises a double-data-rate fourth generation synchronous dynamic random access memory (DDR4 SDRAM) circuit.

5. The control chip for memory power sequence according to claim 4, wherein the power sequence of the memory comprises a power supplying sequence of a VPP power source, a VDD power source or a VDDQ power source, and a VTT power source of the DDR4 SDRAM circuit.

6. The control chip for memory power sequence according to claim 4, wherein the input pins comprise:
   a first multi-function pin, configured to receive a SLP_S4# signal of a chip set of the Intel 2016 KabyLake processor platform or the Intel 2015 SkyLake processor platform, or configured to receive a SLP_S5# signal of an application processor unit of the AMD 2017 AM4 processor platform;
   a second multi-function pin, configured to receive a VPP_PG signal of the Intel 2016 KabyLake processor platform or the Intel 2015 SkyLake processor platform, or configured to receive an AM4R1 signal of the application processor unit of the AMD 2017 AM4 processor platform;
   a third function pin, configured to receive a SLP_S3# signal of the chip set of the Intel 2016 KabyLake processor platform or the Intel 2015 SkyLake processor platform, or configured to receive a SLP_S3# signal of the application processor unit of the AMD 2017 AM4 processor platform; and
   a fourth multi-function pin, configured to receive a DDR_VTT_CNTL signal of a central processor unit of the Intel 2016 KabyLake processor platform or the Intel 2015 SkyLake processor platform, or configured to receive a S0A3_GPIO signal of the application processor unit of the AMD 2017 AM4 processor platform,
   wherein the output pins comprise:
   a fifth multi-function pin, configured to output a first power switching signal to control a power sequence of a VPP power source of the DDR4 SDRAM circuit;
   a sixth multi-function pin, configured to output a second power switching signal to control a power sequence of a VDD power source or a VDDQ power source of the DDR4 SDRAM circuit; and
   a seventh multi-function pin, configured to output a third power switching signal to control a power sequence of a VTT power source of the DDR4 SDRAM circuit.

7. The control chip for memory power sequence according to claim 6, wherein the power sequence circuits comprise a first power sequence circuit, and if the selected processor platform is the Intel 2016 KabyLake processor platform or the Intel 2015 SkyLake processor platform, the first power sequence circuit enables the first power switching signal after the SLP_S4# signal is enabled; the first power sequence circuit enables the second power switching signal after the VPP_PG signal is enabled; the first power sequence circuit disables the second power switching signal after the SLP_S4# signal is disabled; the first power sequence circuit disables the first power switching signal after the second power switching signal is disabled for a first delay time; and the first power sequence circuit selects one of the SLP_S3# signal and the DDR_VTT_CNTL signal to serve as the third power switching signal.

8. The control chip for memory power sequence according to claim 6, wherein the power sequence circuits comprise a second power sequence circuit, and if the selected processor platform is the AMD 2017 AM4 processor platform, the second power sequence circuit enables the first power switching signal after the SLP_S5# signal is enabled for a second delay time; the second power sequence circuit enables the second power switching signal after the first power switching signal is enabled for a third delay time; the second power sequence circuit disables the first power switching signal after the SLP_S5# signal is disabled for the second delay time or after the AM4R1 signal is disabled; the second power sequence circuit disables the second power switching signal after the first power switching signal is disabled for the third delay time; the second power sequence circuit enables the third power switching signal after the SLP_S3# signal and the S0A3_GPIO signal are both enabled; and the second power sequence circuit disables the third power switching signal after the SLP_S3# signal is disabled or after the S0A3_GPIO signal is disabled.

9. A control chip for memory power sequence compatible with an Intel processor platform and an AMD processor platform, the control chip for memory power sequence comprising:
  a first multi-function pin, configured to receive a SLP_S4# signal of a chip set of the Intel processor platform, or configured to receive a SLP_S5# signal of an application processor unit of the AMD processor platform;
  a second multi-function pin, configured to receive a VPP_PG signal of the Intel processor platform, or configured to receive an AM4R1 signal of the application processor unit of the AMD processor platform;
  a third function pin, configured to receive a SLP_S3# signal of the chip set of the Intel processor platform, or configured to receive a SLP_S3# signal of the application processor unit of the AMD processor platform; and
  a fourth multi-function pin, configured to receive a DDR_VTT_CNTL signal of a central processor unit of the Intel processor platform, or configured to receive a S0A3_GPIO signal of the application processor unit of the AMD processor platform;
  a control circuit, coupled to the first multi-function pin, the second multi-function pin, the third function pin and the fourth multi-function pin, wherein when the control circuit determines that the control chip for memory power sequence is operated in the Intel processor platform, the control circuit correspondingly generates a first power switching signal, a second power switching signal and a third power switching signal according to the SLP_S4# signal, the VPP_PG signal, the SLP_S3# signal and the DDR_VTT_CNTL signal, and when the control circuit determines that the control chip for memory power sequence is operated in the AMD processor platform, the control circuit correspondingly generates the first power switching signal, the second power switching signal and the third power switching signal according to the SLP_S5# signal, the AM4R1 signal, the SLP_S3# signal and the S0A3_GPIO signal;
  a fifth multi-function pin, coupled to the control circuit, and configured to output the first power switching signal to control a power sequence of a VPP power source of a DDR4 SDRAM circuit of the Intel processor platform or the AMD processor platform;
  a sixth multi-function pin, coupled to the control circuit, and configured to output the second power switching signal to control a power sequence of a VDD power source or a VDDQ power source of the DDR4 SDRAM circuit; and
  a seventh multi-function pin, coupled to the control circuit, and configured to output the third power switching signal to control a power sequence of a VTT power source of the DDR4 SDRAM circuit.

10. The control chip for memory power sequence according to claim 9, wherein the control circuit comprises:
  a platform selection circuit, configured to provide at least one selection signal instructing the control chip for memory power sequence to be operated in one of the Intel processor platform and the AMD processor platform;
  a first power sequence circuit, configured to generate the first power switching signal, the second power switching signal and the third power switching signal corresponding to the Intel processor platform according to the SLP_S4# signal, the VPP_PG signal, the SLP_S3# signal and the DDR_VTT_CNTL signal;
  a second power sequence circuit, configured to generate the first power switching signal, the second power switching signal and the third power switching signal corresponding to the AMD processor platform according to the SLP_S5# signal, the AM4R1 signal, the SLP_S3# signal and the S0A3_GPIO signal;
  an input selection circuit, coupled to the platform selection circuit to receive the at least one selection signal, and transmitting the SLP_S4# signal, the VPP_PG signal and the DDR_VTT_CNTL signal to the first power sequence circuit according to the at least one selection signal or transmitting the SLP_S5# signal, the AM4R1 signal and the S0A3_GPIO signal to the second power sequence circuit according to the at least one selection signal; and
  an output selection circuit, coupled to the platform selection circuit, the first power sequence circuit and the second power sequence circuit, wherein when the at least one selection signal instructs the control chip for memory power sequence to be operated in the Intel processor platform, the output selection circuit outputs the first power switching signal, the second power switching signal and the third power switching signal of the first power sequence circuit, and when the at least one selection signal instructs the control chip for memory power sequence to be operated in the AMD processor platform, the output selection circuit outputs the first power switching signal, the second power switching signal and the third power switching signal of the second power sequence circuit.

* * * * *

UNITED STATES PATENT AND TRADEMARK OFFICE
CERTIFICATE OF CORRECTION

PATENT NO.        : 9,870,175 B1
APPLICATION NO.   : 15/585188
DATED             : January 16, 2018
INVENTOR(S)       : Hsin-Lung Yang and Ming-Che Hung It is certified that error appears in the above-identified patent and that said Letters Patent is hereby corrected as shown below:

On the Title Page

Item (54) and in the Specification, at Column 1, title, delete Lines 1 and 2 and insert:
--CONTROL CHIP FOR MEMORY POWER SEQUENCE--

Signed and Sealed this
Twenty-third Day of April, 2019

Andrei Iancu
*Director of the United States Patent and Trademark Office*